United States Patent

Mundinger et al.

[11] Patent Number: 5,727,618
[45] Date of Patent: Mar. 17, 1998

[54] MODULAR MICROCHANNEL HEAT EXCHANGER

[76] Inventors: David C. Mundinger, 8362 Rhoda Ave., Dublin, Calif. 94568; D. Philip Worland, 3157 Balmoral Dr., San Jose, Calif. 95132

[21] Appl. No.: 307,398

[22] Filed: Sep. 16, 1994

Related U.S. Application Data

[63] Continuation of Ser. No. 110,874, Aug. 23, 1993, abandoned.

[51] Int. Cl.⁶ ............................................. F28F 7/00
[52] U.S. Cl. .................. 165/80.4; 165/185; 257/714; 361/699; 361/701; 361/702
[58] Field of Search .................. 165/80.4, 185, 165/80.5; 257/714; 361/699, 701, 702, 704

[56] References Cited

U.S. PATENT DOCUMENTS

| | | | |
|---|---|---|---|
| 3,361,195 | 1/1968 | Meyerhoff et al. | 257/714 X |
| 4,494,171 | 1/1985 | Bland et al. | 257/714 X |
| 4,546,614 | 10/1985 | Kline et al. | 165/185 X |
| 4,559,580 | 12/1985 | Lufty | 257/714 X |
| 4,561,040 | 12/1985 | Eastman et al. | 361/699 |
| 4,758,926 | 7/1988 | Herrell et al. | 257/714 X |
| 4,894,709 | 1/1990 | Phillips et al. | 257/714 |
| 4,909,315 | 3/1990 | Nelson et al. | 165/185 X |
| 4,910,642 | 3/1990 | Downing | 257/714 X |
| 4,962,444 | 10/1990 | Niggemann | 165/80.4 X |
| 4,977,954 | 12/1990 | Potier et al. | 165/76 |
| 5,057,908 | 10/1991 | Weber | 257/714 |
| 5,088,005 | 2/1992 | Ciaccio | 257/714 X |
| 5,099,311 | 3/1992 | Bonde et al. | 165/80.4 |
| 5,099,910 | 3/1992 | Walpole et al. | 165/80.4 |
| 5,105,429 | 4/1992 | Mundinger et al. | |
| 5,105,430 | 4/1992 | Mundinger et al. | |
| 5,180,001 | 1/1993 | Okada et al. | 165/80.4 |
| 5,265,670 | 11/1993 | Zingher | 165/80.4 |
| 5,388,635 | 2/1995 | Gruber et al. | 165/80.4 |

FOREIGN PATENT DOCUMENTS

| | | | |
|---|---|---|---|
| 71156 | 3/1989 | Japan | 257/714 |
| 152475 | 6/1993 | Japan | 257/714 |

OTHER PUBLICATIONS

Bland et al., "A Compact High Intensity Cooler (CHIC)", SAE Technical Paper Series, No. 831127 (1983).

*Primary Examiner*—Leonard R. Leo

[57] ABSTRACT

A modular microchannel heat exchanger for cooling a heated region and a method for making the device. A first section of the device features an array of thin copper sheets which are etched with rows of elongated holes that pierce the sheets, coated with silver and held together with the holes aligned. These holes form a microchannel having a desired aspect ratio. A second section of the device has a series of thin copper plates which are etched as apertures, coated with silver and stacked in a sequence on the sheets of the first section, the plate closest to the sheets having elongated apertures oriented transversely to the microchannel of the sheets, the apertures combining further from the sheets into circular apertures to fit a coaxial inlet and outlet conduit where unitary or pipe flow occurs. The inlet conduit is, through the branching series of plates, in communication with alternately spaced elongated apertures adjacent to the microchannel of the sheets, and the outlet conduit is in communication with the other alternate elongated apertures. A case for both sections has an inlet and outlet chamber with holes that the inlet and outlet conduits plug into.

23 Claims, 5 Drawing Sheets

MODULAR MICROCHANNEL HEAT EXCHANGER

This is a continuation of application Ser. No. 08/110,874 filed on Aug. 23, 1993, now abandoned.

TECHNICAL FIELD

This invention relates to apparatus for cooling a heated region in a microminiature device such as a chip structure.

BACKGROUND ART

Excess heat is generated in many electrical and mechanical applications of microminiature devices. Microprocessors, for example, may generate excess heat through internal electrical resistances. Mechanical devices such as those employing micro-machined gears and components also generate unwanted heat through friction between contacting surfaces. Heat produced by such systems can severely hamper the performance and reliability of the devices.

Applications for arrays of integrated laser diode bars in particular are often limited by the ability to remove the waste heat generated during operation. As the bars are more closely packed together, the heat generated by an array must be more efficiently removed to avoid unwanted reductions in the lifetime and efficiency of the bars. Similarly, more efficient removal of heat from the bars is required as the bars are more continuously operated. In addition, since the wavelength of the radiation emitted from the bars varies with the temperature of the bars, it is important that the thermal impedance across an array of laser diode bars is uniform.

In an attempt to alleviate the problem of excess heat generation, such heat generating devices are often bonded with a substrate formed of a thermally conductive material such as copper or silicon. A series of ducts or channels is formed in the substrate in close proximity to the heat generating device. Water, or some other liquid coolant is caused to flow through these channels. Heat flows into the coolant from the substrate and from the fins dividing the channels and is carried away.

The thermal impedance of this cooling device is the sum of the thermal impedance of the substrate and fins, and the thermal impedance of a boundary layer of the coolant. Low thermal impedance of the substrate and fins is achieved by using a thermally conductive material such as copper for the substrate, and by carving the channels into the substrate very closely to the heat source. Typically the distance between the heat source and the channels is less than 1 mm.

The thermal impedance of the coolant boundary layer can be reduced by extending the length of the fins, which effectively increases the area of the coolant boundary layer. Due to the inherently imperfect thermal conductivity of the fins there is a point at which making the fins longer does not help. This is expressed in terms of an aspect ratio, that is, the ratio of the length of the fins to their width. For copper the aspect ratio is about ten to one. The thermal impedance of the coolant boundary layer can also be reduced by narrowing the width of the channels, which effectively reduces the thickness of the coolant boundary layer.

The optimum width of the fins, for a given channel width, involves a tradeoff, as thinner fins allow more of the heat in the fins to escape into the coolant boundary layer, but thicker fins allow more heat to escape through the length of the fins. For fins formed of a very good heat conductor such as copper, and a coolant such as water, an optimum fin width for heat dissipation occurs where the fin width is approximately equal to the width of the channels.

Due to the above constraints, it is desirable for the channels to be narrow and the fins long and thin. Chemical etching techniques are commonly used to carve the channels from a silicon substrate. The crystalline structure of silicon allows for anisotropic etching. As a result, silicon can be chemically etched to form narrow channels bordered by fins with high aspect ratios.

Chemical etching techniques are not capable of carving into a copper substrate without fanning out—resulting in channels that are wedge-shaped rather than rectangular. Due to this fanning out, aspect ratios of ten to one in a copper substrate cannot be achieved using conventional chemical etching techniques. This is unfortunate as copper is the most thermally conductive material commonly available.

Other techniques used for carving channels suffer from other drawbacks. Ion bombardment etching and laser etching, for example, may be used to form narrow channels and fins with high aspect ratios in a copper substrate, but are much more expensive than chemical etching. In a paper entitled: "A Compact High Intensity Cooler," by T. J. Bland, R. E. Niggemann, and M. B. Parekh, presented at the Thirteenth Intersociety Conference on Environmental Systems, San Francisco, Calif., Jul. 11–13, 1983, the authors recognize the advantages of bonding laminar sheets of copper together to form an impingement type cooler for electronic circuits. It is also known in the art to arrange sheets of copper as the walls separating microchannels in an array, however, this technique is cumbersome due to the large numbers (typically hundreds) of walls needed for a single array, and the malleability of copper, which causes difficulties in its machining.

The methods currently used to make microchannels in a substrate therefore present a limitation on the effectiveness of the microchannels for transferring heat.

The factors listed above demand narrow channels and fins with high aspect ratios for optimum heat transfer, however, as the channels become narrower a countervailing factor arises. Narrower channels require a greater pressure to force the coolant through the channels at a flow rate sufficient to remove the heat generated by the heat source.

Another factor also comes into play when devices incorporating the previous factors are to be employed practicably: the need to be able to add, remove or replace such devices quickly and easily. As a result, the devices should be modular in design and able to be quickly and easily plugged into a structure providing coolant, electrical leads and support.

It is an object of the present invention to provide a method for forming channels in a very thermally conductive substrate such as copper which are narrow enough, and the fins separating the channels high enough relative to their width, that the dimensions of the channels and fins provide an optimum means for the substrate, channels, fins and coolant to transfer heat.

It is a further object of the present invention to provide a device for cooling a heated region that transfers heat more efficiently than similar devices known in the art.

It is a further object of the present invention to achieve the above objects in a device which reduces the pressure of the coolant necessary to effectively carry heat from the device.

It is a further object of the present invention to achieve the above objects in a device which is modular.

It is a further object to achieve the above objects at a relatively low cost.

DISCLOSURE OF THE INVENTION

The present invention achieves the above objects by etching, arranging and bonding together a series or stack of thin heat conductive sheets and plates to form two sections of a heat exchanger. In one section, thin sheets form an array of microchannels. Each sheet, preferably copper, is chemically etched so that a row of parallel lines pierce the sheet, and is also etched with registration holes so that the sheets may be precisely aligned when stacked. The etched sheets are then coated with a thin film of silver. The sheets are then stacked together using the registration holes as a guide so that each line is aligned with a line in an adjacent sheet, and the lines form narrow microchannels. A sheet of copper that has not been pierced with lines is placed on one end of the stack to form a thin, thermally conductive layer between the microchannels and the region to be cooled.

In a second section, plates of copper are arranged at the end of the stack of sheets of the first section, opposite to the region to be cooled, to provide a manifold for the coolant. The manifold is constructed in a way that both reduces the pressure required to cause an adequate coolant flow through the microchannels and allows a modular fitting to a source for coolant, electricity and support. The reduction in coolant pressure is accomplished by having the plate of the manifold closest to the microchannels contain a plurality of elongated holes, aligned transversely to and in fluid communication with the microchannels. Alternately spaced apertures in this plate are designed to supply coolant to the microchannels, while the other alternately spaced apertures are designed to receive coolant from the microchannels. Due to this interspacing of coolant supply and drain apertures, the distance the coolant must flow through each microchannel is reduced, and the coolant pressure required to cause a given coolant flow rate through the apertures is proportionally reduced.

The remaining plates of the manifold transform the apertures by combining into larger fluid conduits, becoming paired inlet and outlet conduits where unitary flow can occur, as typically found in pipes. In one embodiment of the invention, the inlet conduit is coaxial with the outlet conduit, allowing the single shaft containing the inlet and outlet conduits to be plugged into a single modular fluid connection. In another embodiment, two modular connections are provided by the separate inlet and outlet connections.

The copper plates of the manifold are plated with a thin film of silver, like the etched sheets of copper. The entire stack of etched sheets and plates is then clamped together with a stainless steel clamp, the clamp having holes allowing for the protrusion of the alignment pins and the inlet and outlet conduits. The alignment pins are removed, and the stack is then heated to a temperature which melts the combination of copper and silver, forming a fused or eutectic alloy and brazing the sheets together, while the copper defining the microchannels and the inlet and outlet apertures and conduits is not melted at this temperature. The clamp is then removed after the stack has cooled and the braze hardened.

The heat sink structure of the present invention may include a microchannel array disposed within a thermally conductive substrate having walls with higher aspect ratios than can be achieved by treating or working a solid block of material. In addition, the manifold structure allows a relatively low coolant pressure to provide an adequate coolant flow through the microchannels, by interspacing inlets to and outlets from the microchannels so that the effective distance that coolant must travel through each microchannel is reduced. The manifold also provides for a modular connection with coolant and other sources by channeling the interspaced inlets and outlets into inlet and outlet conduits accommodating piped flow of coolant. In one preferred embodiment, the inlet and outlet are coaxial, allowing that coaxial conduit to be plugged into a single modular hole in a case containing many such holes. Importantly, this result is achieved in a relatively inexpensive manner.

BEST MODE FOR CARRYING OUT THE INVENTION

Figure 1:
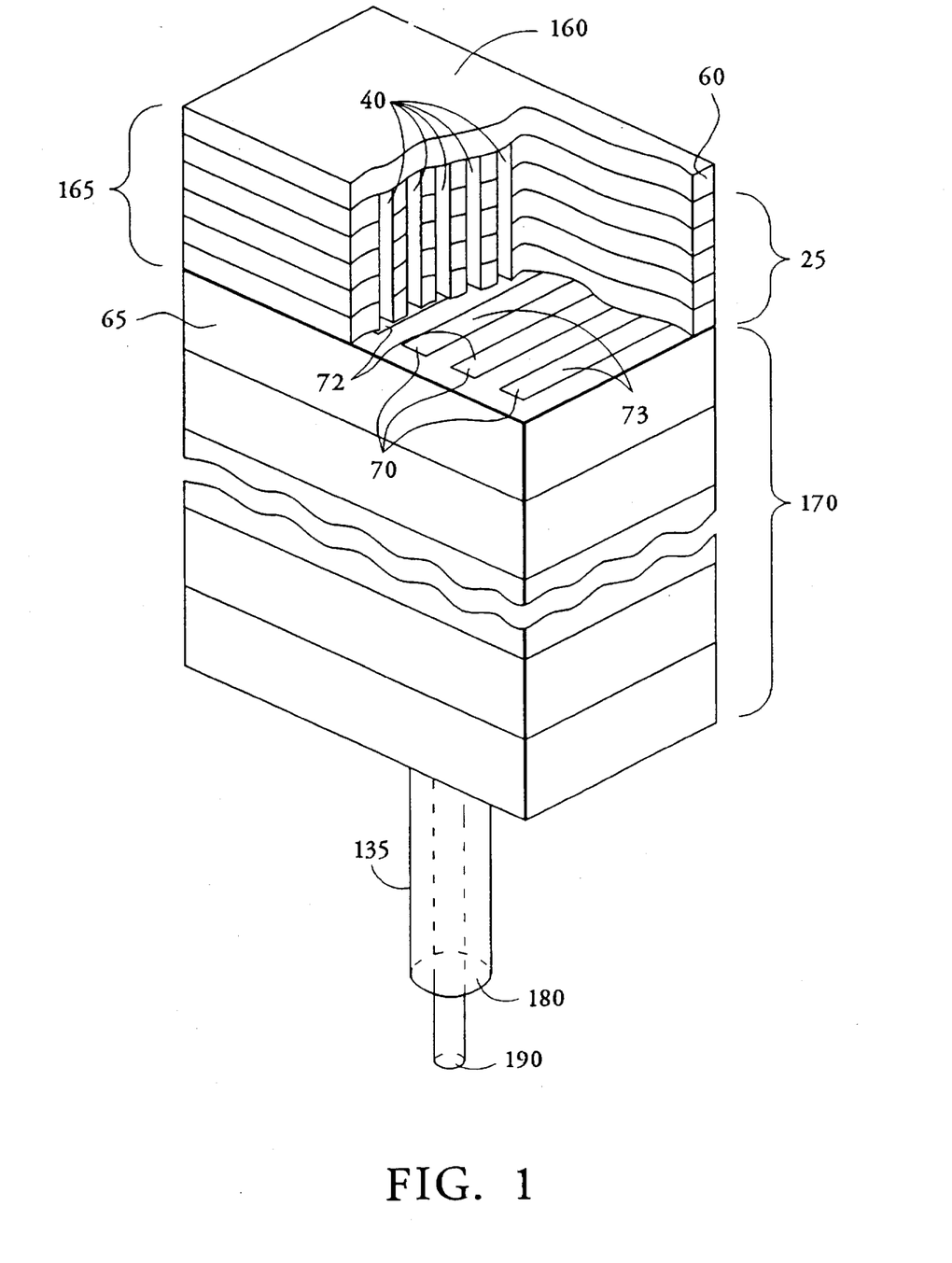
FIG. 1 is a perspective view of a preferred embodiment of the present invention.

Referring now to FIG. 1, a modular microchannel heat exchanger is shown having a first section formed from a stack of thin copper sheets 25. Aside from a solid end sheet 60 which has a surface 160 for contact with a heated region, the sheets 25 have been etched with rows of holes 40 that pierce the sheets. The sheets 25 have been coated with a thin layer of silver, aligned and fused together so that the aligned holes 40 form an array of microchannels 165 within the stack.

A second manifold section 170 formed from a stack of etched copper plates is juxtaposed to the first section with the stack of sheets 25 distal to the solid sheet 60. A first copper plate 65 of the manifold 170 adjoining the microchannel array 165 has a plurality of elongated apertures 70 oriented transversely to and in fluid communication with the microchannels 165. A shaft containing a coaxial inlet and outlet conduit provides fluid to and receives fluid from the manifold stack 170. The series of plates of the manifold 170 form apertures which transform fluid flow from the single inlet conduit 180 to alternately spaced elongated inlet apertures 72 of plate 65, and transform fluid flow back from other alternately spaced elongated outlet apertures 73 of plate 65 to the single outlet conduit 190.

The single shaft 135 having coaxial inlet and outlet conduits plugs into a modular hole in a case having a fluid supply and drain and a plurality of such holes for fitting a plurality of such shafts. The alternately spaced inlet apertures 72 and outlet apertures 73 adjoining the microchannel array 165 lower the pressure required to cause fluid to flow through the microchannels 165. The microchannels 165 are formed in a very thermally conductive substrate of copper with small dimensions and large height-to-width aspect ratios not heretofore economically practicable.

Figure 2:
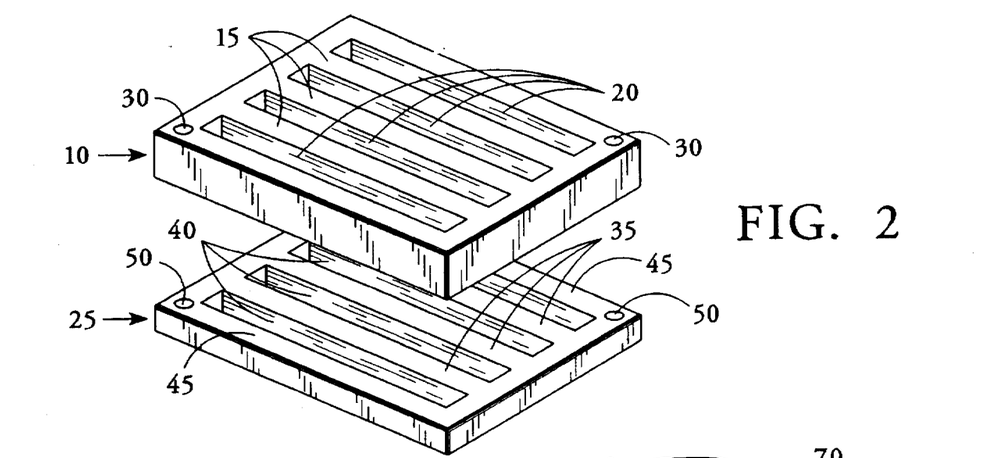
FIG. 2 is an exploded perspective view of a mask and a microchannel sheet of a microchannel section of the heat exchanger of the present invention.

Referring now to FIG. 2, microchannel sheets 25 of a first section of the heat exchanger of the present invention are all identical. The sheets 25 are formed by photolithography wherein a mask 10 is patterned by conventional techniques so that thin lines 15 of the mask 10 remain between alternate lines 20 of a similar size that have been eroded and removed. The lines 15 in this embodiment have a width of about 2 mils and a length of about 2 cm, and the lines 20 are about the same size, although the method described herein can easily produce lines of dramatically varied dimensions. The lines 15 and 20 in this embodiment are straight and parallel to each other, although they could easily be made to be curved or of other shapes, which may be preferable for some uses. Although it is not shown accurately in this drawing, this particular embodiment involves several hundred lines 15 and another several hundred lines 20 per mask 10.

Registration holes 30 of a generally circular shape have also been patterned into opposite corners of the generally rectangular mask 10 by the photoresist process.

The mask 10 is placed on top of a thin sheet of copper 25. The sheet of copper of this particular example is about 2 mils thick and is rectangularly shaped, being about 2 cm long by 1 cm wide, but these dimensions can be varied substantially in other embodiments of this invention. The mask 10 covers the sheet 25, except for an area directly under the lines 20 and the registration holes 30. The sheet is exposed to a chemical that dissolves the sheet 25 where it is exposed. A suitable chemical used to etch portions of the copper sheet 25 is ferric chloride, but any chemical known in the art for etching copper will suffice. The sheet 25 is etched by the chemical directly beneath the lines 20 and the registration holes 30 that expose it to the chemical, but due to the thinness of the sheet 25, lateral erosion of the sheet 25 is insignificant.

The pattern provided by the mask 10 in this embodiment results in a row of narrow lines of copper 35, the lines being the areas of the sheet 25 directly beneath the lines 15 of the mask 10. Alternating with the row of narrow lines of copper 35 is a similarly sized row of elongated holes 40. That is, both the narrow lines of copper 35 and the holes 40 are rectangular and elongated, each being approximately 2 mils high by 2 mils wide by 2 cm long. A larger width of copper has been retained around a border 45 of each sheet 25. Within that border 45, at opposite corners of the sheet 25, generally cylindrical alignment holes 50 have been produced by the exposure of the sheet 25 to the chemical through the registration holes 30 of the mask 10.

The mask 10 is then removed from the sheet 25. This process is duplicated with a number of sheets of copper until a number of identically etched sheets 25 of copper are created.

Figures 3, 4:
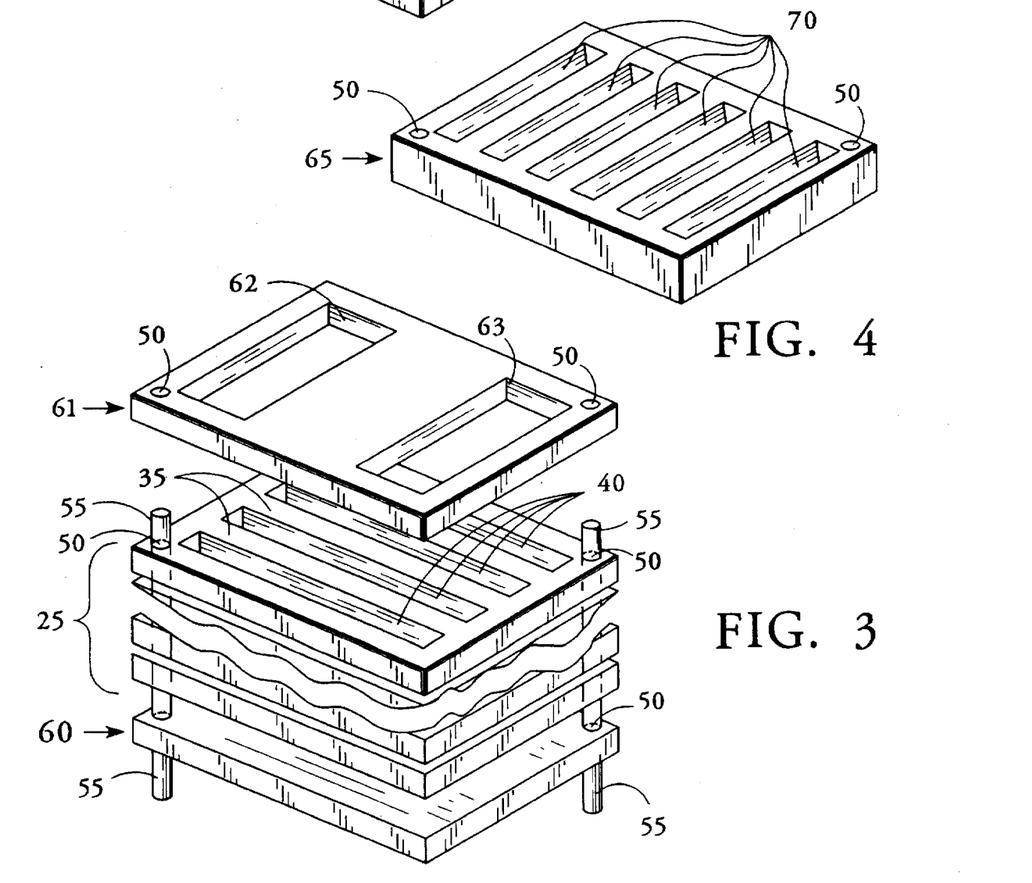
FIG. 3 is an exploded perspective view of a microchannel section of the present invention.
FIG. 4 a perspective view of a first manifold element of a manifold section of the heat exchanger of the present invention.

With reference to FIG. 3, ten etched copper sheets 25 are shown forming the first section of a heat exchanger. Each sheet is approximately 2 mils thick. The etched copper sheets 25 are then coated with a thin layer of silver. This silver coating may be approximately 10 to 50 microinches in thickness; too thin to be accurately depicted in this drawing, but coating all surfaces of the sheets of copper. Although any conventional coating means may be used, electroless plating of the sheets 25 in a bath such as silver cyanide is used in this embodiment as it is economical. Note that the number of sheets 25 may be adjusted to adjust the desired aspect ratio of a microchannel.

Pins 55 are then inserted through the alignment holes 50 in order to precisely align the stack of etched, silver coated sheets 25. Once these sheets have been bonded together, an array of thin parallel walls defining a microchannel array will be formed. A sheet 60 of copper than has not been etched with elongated holes 40 but which has been etched with alignment holes 50 is positioned at an end of the stack of etched sheets 25 to provide a surface to which a device to be cooled is held, and the pins 55 are inserted through its alignment holes 50.

A sheet 61 of copper having an inlet opening 62 and an outlet opening 63 is etched to be in fluid communication with the holes 40. The sheet 61 is positioned at an end of the microchannel array opposite to the end with the solid sheet 60. This structure can then be fused together, in a eutetic bonding method described below, to form an operable cooling device. The solid sheet 60 is brought adjacent to and in thermal communication with a heated region. A pressurized supply of liquid coolant is provided to the inlet opening via an attached conduit, not shown. Another conduit, not shown, is attached to the outlet opening 63 for receiving coolant from the microchannels 40. The very thermally conductive copper substrate defining the narrow microchannels efficiently transports heat from the heated region to the coolant disposed within the microchannels. The heat is carried out of the microchannels by the flow of the coolant.

As the process described above can result in narrow microchannels that may be one mil to five mils in width, another limitation arises, since the pressure required to force the coolant to flow through narrow microchannels can become prohibitive. For a given width and depth of the microchannels, the pressure required to force the fluid through the microchannels at an acceptable rate increases with the length of the channels. To circumvent the high pressure required for such narrow channels, in an alternate embodiment, an inlet and outlet manifold in a second section, joined to the microchannel section, effectively decreases the length of the channels that the fluid must be forced through, and also effectuates a more even thermal impedance across a structure to be cooled, such as a diode laser bar or an array of diode laser bars.

Referring now to FIG. 4, a first copper plate 65 having a thickness of approximately 20 mils has been etched with a plurality of elongated apertures 70 of a larger width than the holes 40 of the sheets 25, and is to be positioned at an end of the stack of sheets opposite to that of the end sheet 60, in place of sheet 61 employed in the prior embodiment. Note that the plates of the second section are substantially thicker, by ten times, than the sheets of the first section. The first plate 65 has been etched with alignment holes 50 such that the elongated apertures 70 of the first plate 65 are generally perpendicular to the elongated holes 40 of the sheets 25 when the pins 55 protruding from the sheets 25 are inserted in the alignment holes 50 of the plate 65. As will be seen in detail in the following description, alternately spaced elongated apertures 70 are for supplying coolant to the microchannels while other alternately spaced elongated apertures 70 are for draining coolant from the microchannels, resulting in a decrease in the distance the coolant must flow in the microchannels from the entire length of the microchannels to the distance between adjacent elongated apertures 70, and a proportional decrease in the coolant pressure required. A series of precisely etched plates are now stacked on the first plate 65.

Figure 5:
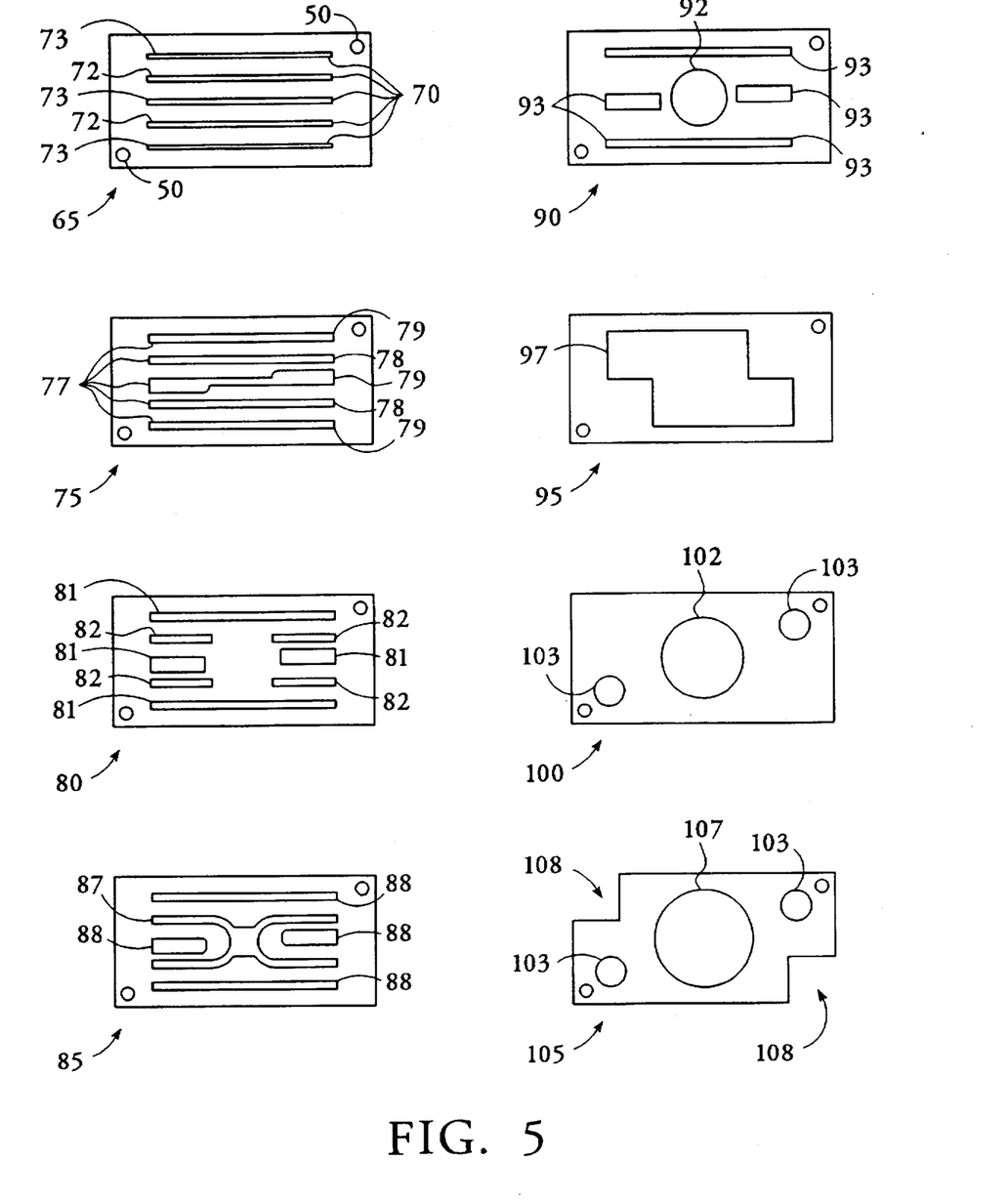
FIG. 5 is a bottom view of manifold elements of the manifold section of the present invention.

Referring now to FIG. 5, a bottom view of the series of etched copper plates is shown. Each of these plates has, like the first plate 65, a thickness of approximately 20 mils, the uniform thickness allowing several copies of each plate to be etched out of a single large sheet of copper. For this process, copper is much easier to work with than silicon, which tends to break when formed in large sheets. For the same reason, the etched sheets of copper 25 described above are also fabricated from a single large copper sheet.

The first plate 65 can be seen to have five elongated apertures 70, and a pair of registration holes 50. The elongated apertures 70 alternate in function; every other aperture is for supplying coolant to the microchannels and the alternate holes are for draining coolant from the microchannels. In this particular embodiment, apertures labeled 72 are for supplying coolant to the microchannels, while those labeled 73 are for draining coolant from the microchannels. Due to this alternating configuration of supply apertures and drain apertures, the pressure required to supply coolant to the microchannels is effectively reduced as the length the coolant travels within the microchannels is reduced from that of the whole length of the microchannel array to that of the distance between a supply aperture and a drain aperture, which can be made smaller or larger by having more or less apertures.

A second plate 75, which is to be attached to the first plate 65 on an opposite side from the microchannels, can be seen to also have five elongated apertures 77 which will be in fluid connection with the apertures 70 of the first plate 65. Thus apertures 78 are for supplying coolant to the microchannels, while apertures 79 are for draining coolant from the microchannels. The apertures 77 are, however, larger than the apertures 70 in order to increase the coolant pressure in the supply apertures 78 and decrease the coolant pressure in the drain apertures 79.

A third plate 80, which is to be attached to the second plate 75 opposite the first plate 65, has a total of eight apertures, all of which can be seen to be in communication with the apertures 77 of plate 75. Apertures 82 are for supplying coolant to the microchannels, while apertures 81 are for draining coolant from the microchannels.

A fourth plate 85, which is to be attached to the third plate 80 opposite the second plate 75, has five apertures, all of which are to be in communication with the apertures 81 and 82 of the third plate 80. Thus, aperture 87 is for supplying coolant to the microchannels and apertures 88 are for draining coolant from the microchannels. In this particular embodiment, two fourth plates are stacked together to increase the thickness of this element.

A fifth plate 90, which is to be attached to a fourth plate 85 opposite the third plate 80, has five apertures, each of which is to be in fluid communication with the apertures of plates 85. Thus the circular central aperture 92 is for supplying coolant while the other apertures 93 are for draining coolant. The foregoing arrangement of plates has thus segregated the supply aperture to a more central location than the drain apertures in order to fit with a coaxial inlet and outlet conduit. Note that the apertures have become larger, now accommodating unitary flow of the coolant. In this fashion, aperture 87 of fourth plate 85, in combination with third plate 80 and aperture 92 of fifth plate 90, symmetrically divide the coolant being supplied to the microchannels.

A sixth plate 95, which is to be attached to the fifth plate 90 opposite a fourth plate 85, has a single, large aperture 97 for draining coolant. Two of these plates 95 are used in this embodiment. An inlet conduit, not shown, is designed to penetrate this aperture 97 to connect with the circular central aperture 92 of plate 90.

A seventh plate 100 has a circular central aperture 102 that is larger than the inlet conduit so that drain coolant from aperture 97 can flow through aperture 102 outside the inlet conduit, which is to be attached to circular central aperture 92. The seventh plate 100 also has a pair of support holes 103 for holding support rods, not shown.

An eighth plate 105, seven of which are to be attached consecutively to the seventh plate 100, has a circular central aperture 107 large enough to house a shaft that contains the inlet and outlet conduits, not shown. The eighth plate 105 also has rectangular cavities 108 in opposite corners of the plate not occupied by support holes 103, the cavities 108 providing space for mounting helicoil plugs, not shown, for electrical connections. The aperture 107 is larger than the aperture 102 by the width of an outer wall surrounding the outlet conduit. A number of eighth plates 105, seven in this embodiment, are to be stacked together so that the shaft containing the coaxial conduits, the support rods, and the helicoil plugs can be held firmly to the manifold.

The etched copper plates are then coated with a thin layer of silver just as the etched sheets were (for efficiency, the plates are coated at the same time as the sheets). Once again, this silver coating may be approximately 10 to 50 microinches in thickness, and is achieved by electroless plating in a bath of silver cyanide.

Figure 6:
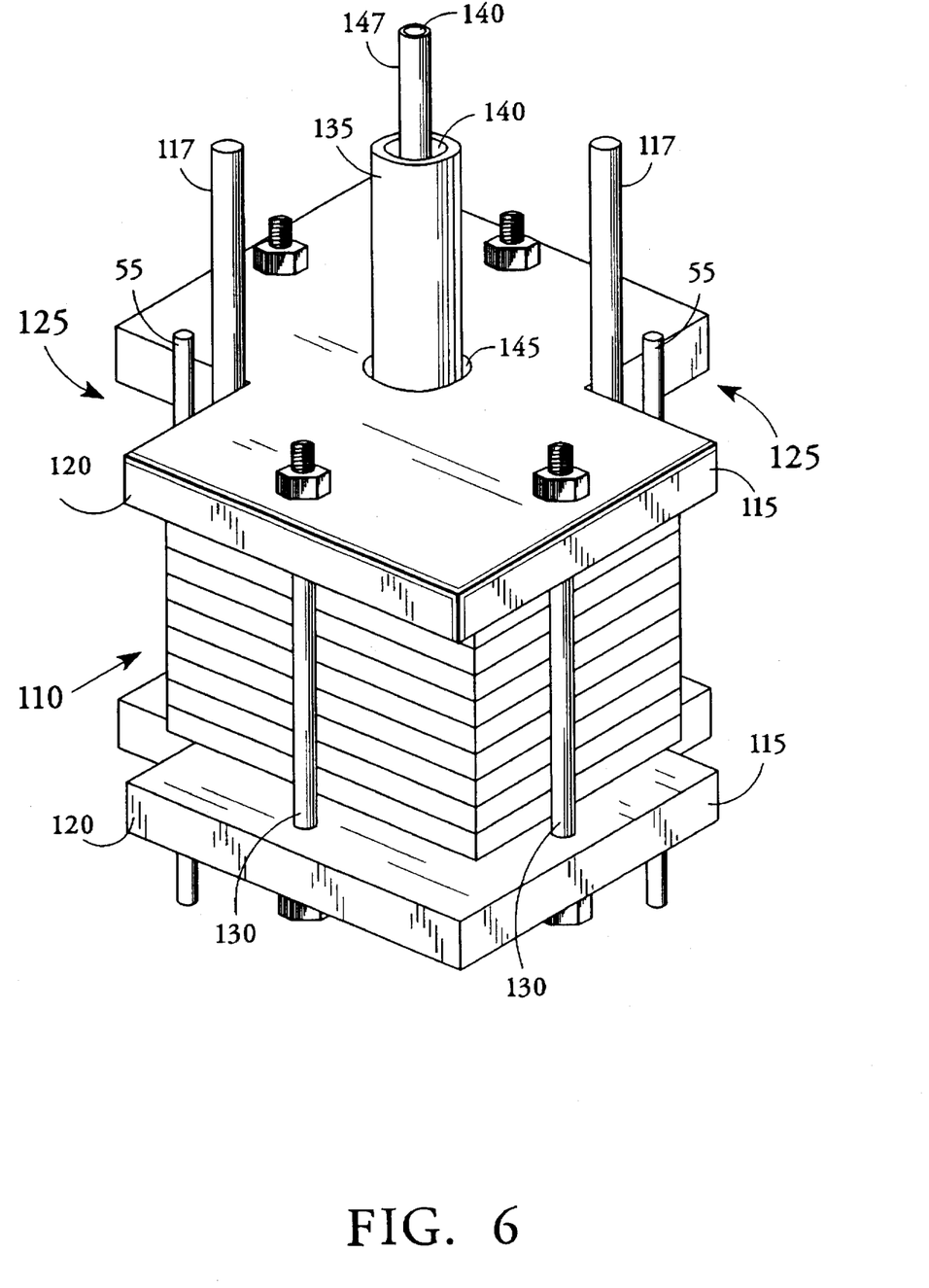
FIG. 6 is a perspective view of the combined microchannel and manifold sections of the present invention.

Referring now to FIG. 6, a block 110 formed from an array of sheets and plates stacked in the sequence previously described is shown. With the pins 55 inserted in the alignment holes, a stainless steel clamp 115 is positioned so that its opposing plates 120 hold the block 110. The plates 120 have each been cut out at opposite corners 125 to allow the pins 55 to protrude beyond the plates 120, and to allow support rods 117 to be inserted into support holes 103, not shown, in one end of the block 110. The plates 120 are connected by a plurality of bolts 130 that are screwed down to clamp the etched, silver coated sheets 25, the end sheet 60 and the manifold 65 to form the block 110. The plates 120 are of a material and dimensions that are inflexible under the amount of pressure required for this clamping, thereby providing a generally even pressure throughout the block 110. After the block 110 has been firmly clamped, the pins 55 are removed, and the block is held in alignment by friction. A shaft 135 housing coaxial conduits 140 is inserted through an opening 145 in the clamping plate 120 on the end of the block 110 holding support rods 117, and into the housing formed by the stack of holes 107, not shown, an inner wall 147 that separates the conduits extending further into the block 110 to connect with the aperture 92, not shown.

The clamped block 110 is then heated to a temperature above that of a eutectic combination of copper and silver. Copper and silver form a eutectic at approximately 790 degrees Centigrade, and so the block 110 is heated to just above that temperature. At this temperature the thin layer of silver then combines with nearby copper to form a eutectic alloy, brazing adjacent etched sheets of copper together, brazing the plates together in the sequence described, and brazing the support rods and the shaft containing coaxial conduits to the plates.

The block 110 with the shaft attached is allowed to cool, and the clamp 115 is then removed, as the block is now held together by the eutectic alloy which has hardened. The result is a modular cooling apparatus containing a very thermally conductive microchannel array in a first section, a manifold that substantially lowers the fluid pressure required to satisfactorily cool that array in a second section joined to the first section, and a single shaft that can easily be plugged into or removed from a fluid source and drain. If the microchannels of the first section are formed in a silicon or copper slice substrate, without sheets, the second section may be used in the same way as described above to transform the microchannels into unitary flow in pipes.

Each aligned stack of copper lines 35 of the sheets 25 has been brazed together to form a single wall approximately 2 mil in width and having an aspect ratio of about ten to one, each wall separating a microchannel of similar dimensions formed from an alignment of holes 40. The eutectic alloy of copper and silver has a thermal conductivity approximately equal to that of copper, so the thin film of eutectic alloy that bonds the copper lines 35 does not impede the flow of heat. The eutectic alloy also forms a thin coating on a surface of the walls of aligned lines 35 bordering the aligned holes 40. While this coating is molten, surface tension causes a smooth surface to form, which remains as the coating hardens, and is of benefit in reducing the friction felt by a coolant which will flow past this surface in order to cool a heated area.

It should be noted that although copper and silver are used in the above described preferred embodiment due to their relative availability, high thermal conductivity, and natural tendency to form a eutectic having a significantly lower melting point than either copper or silver, other similar materials could be used instead. For example lead, tin, gold or other materials known in the art can be used. It should also be noted that while chemical etching is used in the above described preferred embodiment due to its relatively low cost, other means of etching metals that are known in the art may also be employed. For example, electron discharge machining using thin metal wires may be used for etching.

Figure 7:
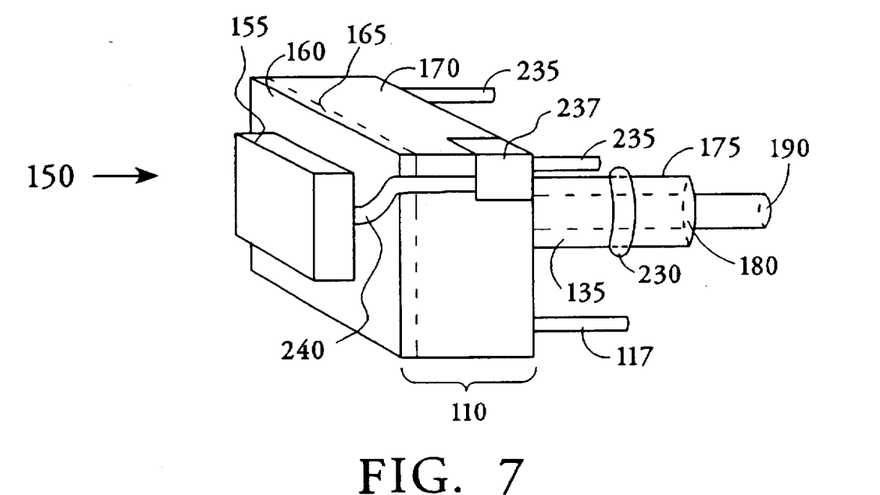
FIG. 7 is a perspective operational view of the heat exchanger of the present invention.

Referring now to FIG. 7, a modular cooling device 150 of the type previously described is shown with a laser diode 155 attached to a surface 160 of the block 110. Although any attachment means that results in a good thermal conductivity between the diode 155 and the surface 160 may be used, the diode 155 in this particular embodiment has been brazed to the surface 160 with a lead-indium braze. A microchannel region 165 is shown adjacent to a manifold 170 formed as described above. Attached to and protruding from the manifold 170 is a shaft 135 having an outer wall 175 containing an outer conduit 180 which is separated by the inner wall 147 from an inner conduit 190.

Figure 8:
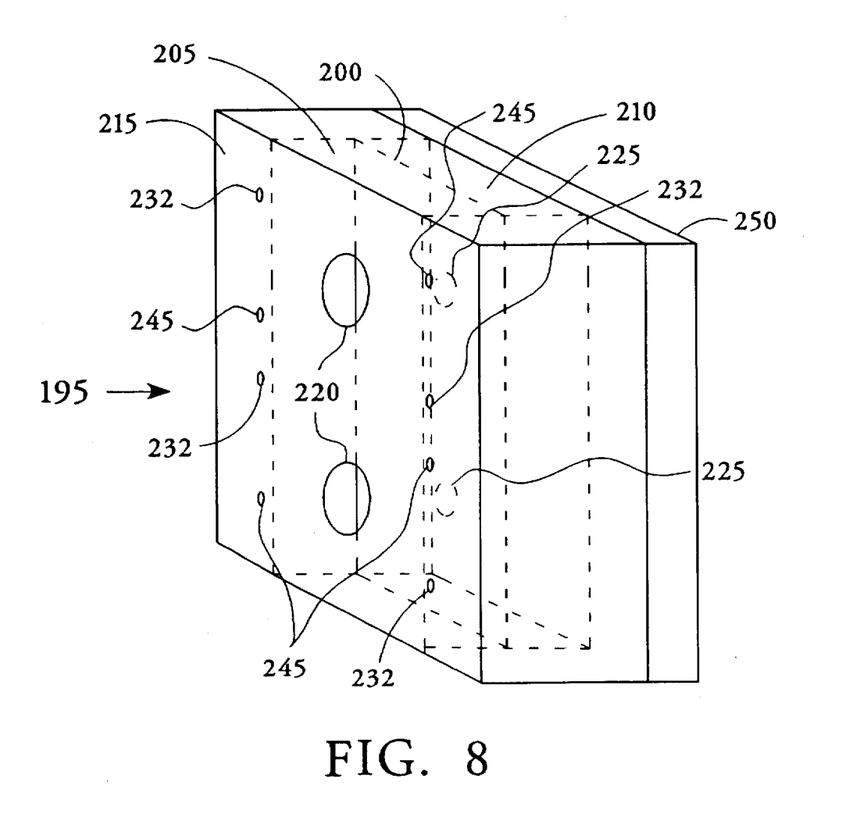
FIG. 8 is a perspective diagram of a case element with modular fittings for coolant inlet and outlet conduits, electrical leads, and mechanical support of the heat exchanger of the present invention.

A portion of a case 195 can be seen in FIG. 8 to have a partition 200 separating a first chamber 205 from a second chamber 210, the partition being generally parallel to a face 215 of the case 195. The face 215 of the case 195 has been drilled with an array of outer holes 220 sized to fit the shaft 135 shown in FIG. 5 or a shaft of any other such modular cooling device. An array of inner holes 225 has been drilled in the partition 200, each inner hole 225 coaxial with an outer hole 220, each inner hole sized to snugly receive the inner wall 147 or an inner wall of any other modular cooling device. The inner wall 147 extends beyond the outer wall 175 so that the inner conduit 190 is in fluid communication with the second chamber 210 while the outer conduit 180 is in fluid communication with the first chamber 205.

In this particular example, the second chamber 210 is filled with liquid coolant under pressure while the first chamber 205 provides a drain for coolant from the cooling devices 150, although the functions of the chambers could be reversed. An o-ring 230 is fitted around the shaft 135 and is compressed to seal the outer hole 220 when the manifold 170 is drawn against the case 195 by modular support rods 117 fitted into holes 232 in the case 195. The inner holes 225 have no seal other than the closeness with which the inner walls 185 fit, but the amount of coolant that escapes from one chamber to the other has been measured and found to be insignificant.

Modular electronic leads 235 are screwed into helicoil plugs 237 attached at opposite corners of the manifold 170. The plugs 237 provide electrical contacts with the laser diode 155 via thin, insulated conductive strips 240. The leads 235 fit in holes 245 and extend through the case 195 and connect with an electrical circuit board 250 at the back of the case 195. The coaxial formation of inlet and outlet conduit conduits within a single shaft is an aid to the modularity of the devices; since each shaft has to align with only one outer hole, small machining errors in the position of the shafts relative to that of the holes do not prevent the shafts from plugging into a single case. Although the inner walls also need to be aligned with the inner holes, this alignment can be accomplished despite small machining errors by tilting the shaft slightly. In a particular application, twenty or more such modular laser diode and cooling devices may be plugged into a case.

Another preferred embodiment of the present invention, not shown, is essentially the same as the previous embodiment, except that the inlet and outlet conduits are separate rather than coaxial. That is, the microchannels are formed in the same manner, defined by an array of narrow copper walls having aspect ratios of about ten to one, and the microchannels are fed with fluid by alternately spaced elongated apertures oriented transversely to the microchannels, with the other alternately spaced, transversely oriented, elongated apertures draining fluid from the microchannels. In this embodiment, however, the alternately spaced inlet apertures receive fluid that is channeled from one half of the manifold, while the fluid drained from the other alternately spaced apertures, is channeled to another half of the manifold. An inlet conduit is connected to the half of the manifold feeding the inlet apertures, and an outlet conduit is connected to the other half of the manifold for draining fluid from the outlet apertures.

Other embodiments of the invention, which are also not shown, involve substitutions and rearrangements of the above described elements. Thus, for example, the manifold and shaft can be made of plastic rather than copper, since the thermal conductivity of the manifold and shaft are not important to the invention, and plastic may be cheaper and lighter in weight than copper. Other preferred embodiments involve forming narrow microchannels of silicon, diamond, tin or other materials instead of copper, and connecting those microchannels to a pressure reducing manifold described above. Still other embodiments involve dividing the microchannels into short lengths with walls oriented transversely to the microchannels, each short length being in communication with a single inlet aperture and a single outlet aperture which are parallel to the transversely oriented walls. In this embodiment, inlet apertures can be adjacent to other inlet apertures and outlet apertures can be adjacent to other outlet apertures, as long as a wall in the microchannels separates adjacent apertures having the same function. This allows the grouping of the multiple inlet apertures and outlet apertures into a single inlet aperture and outlet aperture within the manifold to be more easily accomplished. In yet another embodiment of the invention, the microchannels are connected at alternating ends to form a single, serpentine microchannel.

We claim:

1. An apparatus for cooling a heated region comprising:

a liquid coolant;

a thermally conductive substrate in heat exchange communication with said heated region;

a first body having a plurality of elongated passageways;

a second body, disposed between said substrate and said first body, with said second body being in heat exchange communication with said substrate and including a plurality of microchannels, with said plurality of elongated passageways defining a plurality of inlet apertures and a plurality of outlet apertures, with said plurality of inlet and outlet apertures being interspaced and in flow communication with said plurality of microchannels;

means, in flow communication with said plurality of inlet apertures, for symmetrically dividing a stream of said liquid coolant moving toward said plurality of inlet apertures into a plurality of coolant flows, said symmetrically dividing means formed from a plurality of laminae arranged as a contiguous stack, each of said plurality of laminae having multiple throughaways disposed therein, with a subset of said multiple throughways of adjacent laminae being aligned, defining a flow path in fluid communication with said plurality of inlet apertures, a first of said plurality of laminae being disposed between a second and third of said plurality of laminae and having one said throughway including a central portion and a pair of tributary portions, each of which extends from said central portion in opposing directions, with said second of said plurality of laminae having one said throughway with a cross-sectional area coinciding with a region of said central portion and said third of said plurality of laminae having a barrier portion coinciding with said region and having a plurality of said throughways, so that a flow traveling along said flow path and through said central portion is evenly divided by passing through said pair of tributary portions and a subgroup of said plurality of throughways;

means, in fluid communication with said symmetrically dividing means, for supplying said coolant to said inlet apertures via said subset of said multiple throughways; and means for receiving said coolant from said outlet apertures.

2. The apparatus of claim 1 wherein said first and second bodies each comprises of a plurality of sheets arranged as a contiguous stack, with each of said plurality of sheets having a thickness of less than five mils and openings having a similar width.

3. The apparatus of claim 2 wherein said sheets are silver plated copper.

4. The apparatus of claim 1 further including means, disposed between said supplying means and said inlet apertures, for creating a pressure differential between a flow of coolant entering said inlet apertures and a flow of said coolant exiting said outlet apertures.

5. An apparatus for cooling a heated region comprising:

a liquid coolant, a thermally conductive first section having a solid thermally conductive layer adjacent to, and in heat exchange communication with, said heated region, and a contiguous stack of sheets, each having a plurality of elongated holes mostly in alignment with corresponding holes in abutting adjacent sheets of said stack defining a plurality of microchannels adapted to receive a liquid coolant flow, a second section, juxtaposed to the first section and distal to said heated region, having a contiguous sequence of plates, defining inlet and outlet apertures, a combined inlet and outlet aperture in one of said sequence of plates positioned distal to said first section, and a plurality of laminae disposed between said combined aperture and said plurality of inlet apertures and arranged as a contagious stack, each of said plurality of laminae having multiple throughways disposed therein, with a subset of said multiple throughways of adjacent laminae being aligned, defining a flow path in fluid communication with both said plurality of inlet apertures and said combined aperture, a first of said plurality of laminae being disposed between a second and third of said plurality of laminae and having one said throughway including a central portion and pair of tributary portions, each of which extends from said central portion in opposing directions, with said second of said plurality of laminae having one said throughway with a cross-sectional area coinciding with a region of said central portion and said third of said plurality of laminae having a barrier portion coinciding with said region and having a plurality of said throughways, so that said reciprocal flow traveling along said flow path and through said central portion is symmetrically divided by passing through said pair of tributary portions and a subgroup of said plurality of throughways, a means for supplying said coolant to said combined aperture, and a means for receiving said coolant from said combined aperture.

6. The apparatus of claim 5 wherein said means for supplying said coolant to said combined aperture and said means for receiving said coolant from said combined aperture include a nested inlet and outlet conduit pair.

7. The apparatus of claim 6 wherein the conduits of said inlet and outlet conduit pair are coaxial.

8. The apparatus of claim 5 wherein said sheets and plates are silver plated copper.

9. The apparatus of claim 5 wherein said sheets of said first section are substantially thinner than said plates of the second section.

10. The apparatus of claim 5 wherein said sheets of said first section have a thickness of less than five mils.

11. A modular apparatus for cooling a heated device comprising:

a liquid coolant, a thermally conductive substrate having a surface in thermal contact with said heated device and having subsurface walls formed by contiguous stack of sheets with elongated openings therein aligned with corresponding openings in abutting adjacent sheets of said stack that define a plurality of microchannels, a manifold joined to said substrate distal to said surface and having a first end with a combined inlet and outlet aperture therein and a second end with a plurality of inlet and outlet apertures therein and a plurality of laminae arranged as a contagious stack, each of said plurality of laminae having multiple throughways disposed therein, with a subset of said multiple throughways of adjacent laminae being aligned, defining a flow path in fluid communication with both said combined aperture and said plurality of inlet apertures, a first of said plurality of laminae being disposed between a second and third of said plurality of laminae and having one said throughway including a central portion and pair of tributary portions, each of which extends from said central portion in opposing directions, with said second of said plurality of laminae having one said throughway with a cross-sectional area coinciding with a region of said central portion and said third of said plurality of laminae having a barrier portion coinciding with said region and having a plurality of said throughways, so that a flow traveling along said flow path and through said central portion is evenly divided by passing through said pair of tributary portions and a subgroup of said plurality of throughways, a shaft attached to said manifold housing a nested inlet and outlet conduit pair, with the inlet conduit being in fluid communication with said inlet apertures and the outlet conduit being in fluid communication with said outlet apertures;

means for supplying said coolant to said inlet conduit, means, disposed between said supplying means and said inlet apertures, for creating a pressure differential between a flow of coolant entering said inlet apertures and a flow of coolant exiting said outlet apertures, and a means for draining said coolant from said outlet conduit.

12. The apparatus of claim 7 wherein said inlet and outlet conduits are coaxial, being contained within an outer wall and separated by an inner wall of said shaft.

13. The apparatus of claim 7 wherein said shaft has an end distal to said manifold with a modular fitting means for connection to a case having a front and a rear chamber separated by a partition.

14. The apparatus of claim 13 wherein said outer wall fits into a hole in a face of said case and terminates within said front chamber, and said inner wall fits into a hole in said partition, terminating within said rear chamber.

15. The apparatus of claim 13 having modular electronic leads penetrating said case to connect said device with an electronic circuit board at the rear of said case.

16. The apparatus of claim 11 wherein said walls are less than five mils in width and have height-to-width aspect ratios of at least eight to one, said height dimension of said walls being generally perpendicular to said surface.

17. The apparatus of claim 11 wherein said inlet apertures and said outlet apertures in fluid communication with said microchannels are oriented transversely thereto.

18. A modular apparatus for cooling a heated region comprising:

a thermally conductive substrate having a surface adjacent to and in thermal communication with a heated region and a plurality of subsurface walls that define a plurality of microchannels, a manifold having a first end with a plurality of inlet and outlet apertures in fluid communication with said plurality of microchannels, a second end with nested inlet and outlet conduits and a plurality of laminae arranged as a contiguous stack disposed therebetween, with said outlet apertures being in fluid communication with said outlet conduit, and each of said plurality of laminae having multiple throughways disposed therein, with a subset of said multiple throughways of adjacent laminae being aligned, defining a flow path in fluid communication with both said plurality of inlet apertures and said inlet conduit, a first of said plurality of laminae being disposed between a second and third of said plurality of laminae and having one said throughway including a central portion and a pair of tributary portions, each of which extends from said central portion in opposing directions, with said second of said plurality of laminae having one said throughway with a cross-sectional area coinciding with a region of said central portion and said third of said plurality of laminae having a barrier portion coinciding with said region and having a plurality of throughways, said inlet and outlet apertures being alternately interspersed across said plurality of microchannels, such that at least one of said inlet apertures is adjacent to, and in fluid communication with, a plurality of said outlet apertures and at least one of said outlet apertures is adjacent to, and in fluid communication with, a plurality of said inlet apertures, said adjacent apertures being in fluid communication with each other via said plurality of microchannels whereby a flow traveling through said central portion is symmetrically divided by passing through said pair of tributary portions and a subgroup of said plurality of throughways, a case having an inlet and an outlet chamber, the case having a plurality of modular holes fitting said nested inlet and outlet conduits with said inlet conduit being in fluid communication with said inlet chamber and said outlet conduit being in fluid communication with said outlet chamber, means for supplying fluid to said inlet chamber, and means for receiving fluid from said outlet chamber.

19. The apparatus of claim 18 wherein said inlet and outlet conduits are coaxial and contained within an outer wall and separated by an inner wall of said shaft.

20. The apparatus of claim 18 wherein both said surface and said walls are comprised of copper less than five mils in thickness.

21. The apparatus of claim 18 wherein said apertures of said manifold generally increase in size in a direction away from said microchannel.

22. An apparatus for cooling a heating region comprising:

a liquid coolant;

a thermally conductive substrate in heat exchange communication witch said heated region;

a first body having a plurality of elongated passageways defining a plurality of inlet and outlet apertures, and a plurality of laminae arranged as a contiguous stack, each of said plurality of laminae having multiple throughways disposed therein, with a subset of said multiple throughways of adjacent laminae being aligned, defining a flow path in fluid communication with said plurality of inlet apertures, a first of said plurality of laminae being disposed between a second and third of said plurality of laminae and having one said throughway including a central portion and a pair tributary of portions, each of which extends from said central portion in opposing directions, with said second of said plurality of laminae having one said throughway with a cross-sectional area coinciding with said central portion and said third of said plurality of laminae having a barrier portion coinciding with said central portion and having a plurality of said throughways;

a second body, disposed between said substrate and said first body, with said second body being in heat exchange communication with said substrate and including a plurality of microchannels, with said plurality of inlet and outlet apertures being in flow communication with said microchannels and oriented so that a longitudinal axis of each of said plurality of passageways extends transverse to a longitudinal axis of each of said plurality of microchannels, whereby flow traveling along said flow path and through said central portion is symmetrically divided by passing through said pair of tributary portions and a subgroup of said plurality of throughways;

means for supplying said coolant to said inlet apertures;

means, disposed between said supplying means and said inlet apertures, for creating a pressure differential between a flow of coolant entering said inlet apertures and a flow of said coolant exiting said outlet apertures; and means for receiving said coolant from said outlet apertures.

23. The apparatus of claim 22 wherein said means for supplying said coolant to said inlet apertures and said means for receiving said coolant from said outlet apertures consist of a shaft defining a nested inlet and outlet conduit pair.

* * * * *

UNITED STATES PATENT AND TRADEMARK OFFICE
CERTIFICATE OF CORRECTION

PATENT NO. : 5,727,618
DATED : March 17, 1998
INVENTOR(S) : David C. Mundinger et al.

It is certified that error appears in the above-identified patent and that said Letters Patent is hereby corrected as shown below:

Claim 5, column 12, line 4, "contagious" should read - - contiguous - -.
Claim 11, column 12, line 55, "contagious" should read - -contiguous - -.
Claim 22, column 14, line 34, "witch" should read - - with - -.

On the title page:
  "[76]" should be --[75];
  --[73] Assignee: SDL, Inc., San Jose, Calif.--, should be inserted before item "[21]"; and
  --Attorney, Agent, or Firm--Thomas Schneck--, should be inserted before item "[57]".

Signed and Sealed this

Twenty-fifth Day of August, 1998

Attest:

BRUCE LEHMAN

Attesting Officer

Commissioner of Patents and Trademarks